(12) United States Patent
Li et al.

(10) Patent No.: US 10,541,257 B2
(45) Date of Patent: Jan. 21, 2020

(54) ARRAY SUBSTRATE, DISPLAY PANEL AND DISPLAY DEVICE

(71) Applicants: BOE Technology Group Co., Ltd., Beijing (CN); Chongqing BOE Optoelectronics Technology Co., Ltd., Chongqing (CN)

(72) Inventors: Peng Li, Beijing (CN); Zhe Li, Beijing (CN); Xiaoji Li, Beijing (CN); Jaikwang Kim, Beijing (CN); Keke Gu, Beijing (CN); Lan Xin, Beijing (CN)

(73) Assignees: BOE Technology Group Co., Ltd., Beijing (CN); Chongqing BOE Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 16/004,978

(22) Filed: Jun. 11, 2018

(65) Prior Publication Data
US 2019/0067330 A1 Feb. 28, 2019

(30) Foreign Application Priority Data
Aug. 30, 2017 (CN) .......................... 2017 1 0763491

(51) Int. Cl.
*H01L 27/12* (2006.01)
(52) U.S. Cl.
CPC .................................. *H01L 27/124* (2013.01)

(58) Field of Classification Search
CPC ... H01L 27/3276–3279; H01L 27/3297; H01L 3/3233–3258; H01L 2300/0408; H01L 27/1218; H01L 27/124
See application file for complete search history.

(56) References Cited

U.S. PATENT DOCUMENTS

| | | | |
|---|---|---|---|
| 2004/0147825 A1* | 7/2004 | Milojevic | A61N 1/0541 600/372 |
| 2016/0299599 A1* | 10/2016 | Kang | G06F 3/044 |

* cited by examiner

*Primary Examiner* — Dale E Page
*Assistant Examiner* — Wilner Jean Baptiste
(74) *Attorney, Agent, or Firm* — Arent Fox LLP; Michael Fainberg

(57) ABSTRACT

The disclosure discloses an array substrate, a display panel and a display device. The array substrate includes a peripheral circuit area in which a plurality of first wire grooves, a plurality of second wire grooves, a plurality of first lead wires and a plurality of second lead wires are arranged, wherein each first lead wire is arranged corresponding to one of the first wire grooves, and laid out on a bottom and sidewalls of a corresponding first wire groove; and each second lead wire is arranged corresponding to one of the second wire grooves, and a plurality of recesses and protrusions are arranged alternately on a bottom surface of each second wire groove along an extension direction of the each second wire groove, wherein each second lead wire is laid out on surfaces of recesses and protrusions on a bottom surface of a corresponding second wire groove.

17 Claims, 1 Drawing Sheet

ARRAY SUBSTRATE, DISPLAY PANEL AND DISPLAY DEVICE

CROSS-REFERENCE TO RELATED APPLICATION

This Application claims priority to Chinese Patent Application No. 201710763491.9, filed on Aug. 30, 2017, the content of which is incorporated by reference in the entirety.

TECHNICAL FIELD

This disclosure relates to the field of display technologies, and particularly to an array substrate, a display panel and a display device.

DESCRIPTION OF RELATED ART

In a common display panel, lead wires are required in a peripheral circuit area on an array substrate to connect a display area with an integrated circuit, and for example, gate lines or signal lines in the display area are connected with a display drive chip using a plurality of lead wires.

In an array substrate in the related art, lead wires are arranged using the same material, thickness, and lead width thereof, where the resistance of each lead wire is in direct proportion to a length thereof as per the Ohm's Law. For the plurality of lead wires connected with the same chip, a size of the chip is typically smaller than a size of the display area, so it is difficult to arrange the lead wires so that lengths of all the lead wires remain uniform, but typically a length of a lead wire connected with a pin in an end area of the chip is larger than a length of a lead wire connected with a pin in a central area of the chip, so that the resistance of the lead wire connected with the pin in the end area of the chip is higher than the resistance of the lead wire connected with the pin in the central area of the chip. If there is a significant difference in resistance between the different lead wires, then there may be a higher probability of display abnormality on the display panel, thus easily resulting in non-uniform brightness of a grayscale image, traverse and longitudinal lines, etc., for example, and consequently degrading the reliability of the display panel.

SUMMARY

Embodiments of the disclosure provide an array substrate, a display panel and a display device.

In an aspect, embodiments of the disclosure provide an array substrate including a peripheral circuit area in which a plurality of first wire grooves, a plurality of second wire grooves, a plurality of first lead wires, and a plurality of second lead wires are arranged, wherein: each of the plurality of first lead wires is arranged corresponding to one of the plurality of first wire grooves, and laid out on a bottom and sidewalls of a corresponding first wire groove; and each of the plurality of second lead wires is arranged corresponding to one of the plurality of second wire grooves, and a plurality of recesses and protrusions are arranged alternately on a bottom surface of each of the plurality of second wire grooves along an extension direction of the each of the plurality of second wire grooves, wherein each of the plurality of second lead wires is laid out on surfaces of recesses and protrusions on a bottom surface of a corresponding second wire groove.

In some embodiments, a width of each of the plurality of first wire grooves is the same as a width of each of the plurality of second wire grooves.

In some embodiments, a width of a projection of each of the plurality of first lead wires onto a surface of the peripheral circuit area is the same as a width of a projection of each of the plurality of second lead wires onto the surface of the peripheral circuit area.

In some embodiments, each of the plurality of first lead wires and each of the plurality of second lead wires are made of a same material.

In some embodiments, when the plurality of first lead wires and the plurality of second lead wires are connected with a same chip, the plurality of first lead wires are configured to be connected with pins in an end area of the chip, and the plurality of second lead wires are configured to be connected with pins in a central area of the chip.

In some embodiments, the array substrate further includes a third lead wire arranged on the peripheral circuit area and arranged with no corresponding wire groove.

In some embodiments, a transverse section of each of the plurality of first wire grooves is a rectangle, a trapezium, a triangle, or an arc; and is perpendicular to an extension direction of the each of the plurality of first wire grooves.

In some embodiments, longitudinal sections of each recess and each protrusion on the bottom surface of each of the plurality of second wire grooves are rectangles, trapezia, triangles, or arcs; and are perpendicular to an extension direction of the each of the plurality of second wire grooves.

In another aspect, the embodiments of the disclosure further provide a display panel including an array substrate; wherein the array substrate includes a peripheral circuit area in which a plurality of first wire grooves, a plurality of second wire grooves, a plurality of first lead wires, and a plurality of second lead wires are arranged, wherein: each of the plurality of first lead wires is arranged corresponding to one of the plurality of first wire grooves, and laid out on a bottom and sidewalls of a corresponding first wire groove; and each of the plurality of second lead wires is arranged corresponding to one of the plurality of second wire grooves, and a plurality of recesses and protrusions are arranged alternately on a bottom surface of each of the plurality of second wire grooves along an extension direction of the each of the plurality of second wire grooves, wherein each of the plurality of second lead wires is laid out on surfaces of recesses and protrusions on a bottom surface of a corresponding second wire groove.

In some embodiments, a width of each of the plurality of first wire grooves is the same as a width of each of the plurality of second wire grooves.

In some embodiments, a width of a projection of each of the plurality of first lead wires onto a surface of the peripheral circuit area is the same as a width of a projection of each of the plurality of second lead wires onto the surface of the peripheral circuit area.

In some embodiments, each of the plurality of first lead wires and each of the plurality of second lead wires are made of a same material.

In some embodiments, when the plurality of first lead wires and the plurality of second lead wires are connected with a same chip, the plurality of first lead wires are configured to be connected with pins in an end area of the chip, and the plurality of second lead wires are configured to be connected with pins in a central area of the chip.

In some embodiments, the array substrate further includes a third lead wire arranged on the peripheral circuit area and arranged with no corresponding wire groove.

In some embodiments, a transverse section of each of the plurality of first wire grooves is a rectangle, a trapezium, a triangle, or an arc; and is perpendicular to an extension direction of the each of the plurality of first wire grooves.

In some embodiments, longitudinal sections of each recess and each protrusion on the bottom surface of each of the plurality of second wire grooves are rectangles, trapezia, triangles, or arcs; and are perpendicular to an extension direction of the each of the plurality of second wire grooves.

In still another aspect, embodiments of the disclosure further provide a display device including the display panel above according to the embodiments of the disclosure.

BRIEF DESCRIPTION OF THE DRAWINGS

In order to make the technical solutions according to embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

The technical solutions according to embodiments of the disclosure will be described below clearly and fully with reference to the drawings in the embodiments of the disclosure, and apparently the embodiments to be described are only a part but not all of the embodiments of the disclosure. Based upon the embodiments here of the disclosure, all the other embodiments which can occur to those ordinarily skilled in the art without any inventive effort shall fall into the scope of the disclosure.

Figure 1:
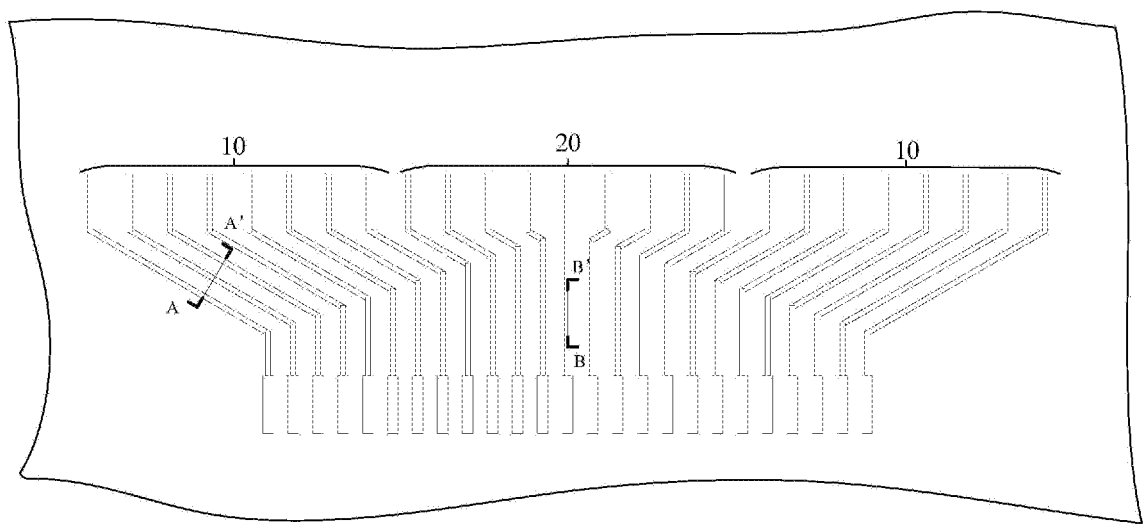
FIG. 1 is a schematic structural diagram of a part of a peripheral circuit area of an array substrate according to the embodiments of the disclosure.
Figure 2:
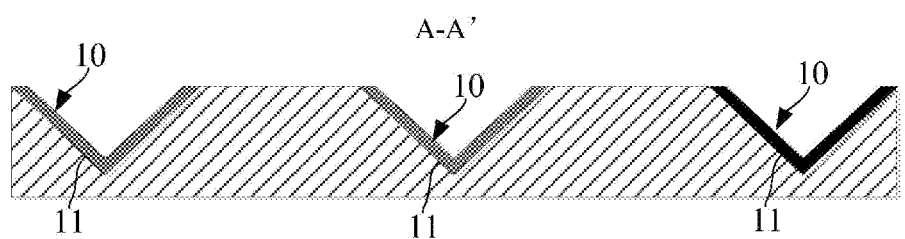
FIG. 2 is a schematic structural diagram of a first lead wire as illustrated in FIG. 1 in a transverse sectional view along A-A'.
Figure 3:
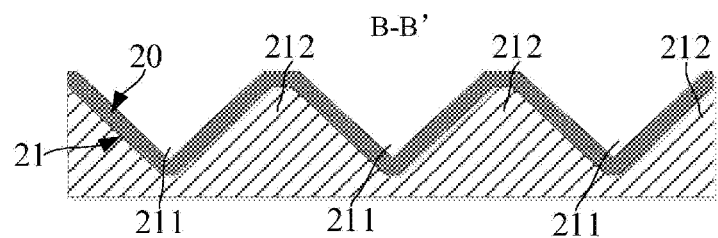
FIG. 3 is a schematic structural diagram of a second lead as illustrated in FIG. 1 in a longitudinal sectional view along B-B'.

Embodiments of the disclosure provide an array substrate. As illustrated in FIG. 1 to FIG. 3, the array substrate includes a peripheral circuit area in which a plurality of first lead wires 10, a plurality of second lead wires 20, a plurality of first wire grooves 11 and a plurality of second wire grooves 21 are arranged.

Where each of the plurality of first lead wires 10 is arranged corresponding to one of the plurality of first wire grooves 11, and laid out on a bottom and sidewalls of a corresponding first wire groove 11; and each of the plurality of second lead wires 20 is arranged corresponding to one of the plurality of second wire grooves 21, and a plurality of recesses 211 and protrusions 212 are arranged alternately on a bottom surface of each of the plurality of second wire grooves 21 along an extension direction of the each of the plurality of second wire grooves 21, where each of the plurality of second lead wires 20 is laid out on surfaces of recesses 211 and protrusions 212 on a bottom surface of a corresponding second wire groove 21.

As can be apparent from the Ohm's Law of $R=\rho L/S$, when an effective width of a first lead wire 10 increases, the resistance thereof decreases, and when the effective length of a second lead wire 20 increases, the resistance thereof rises, where $\rho$ is the resistivity of a material of which a resistor is made, L is a length of a wire wound into the resistor, S is a cross section area of the wire wound into the resistor, and R is the resistance.

Therefore, in the array substrate according to the embodiments of the disclosure, the first wire grooves and the second wire grooves are arranged in the peripheral circuit area, and the first lead wires in the first wire grooves are laid on the bottoms and the sidewalls of the first wire grooves, so that the effective lead widths of the first lead wires can be increased to thereby lower the resistance of the first lead wires; and there are arranged on the bottom surfaces of the second wire grooves a plurality of recesses and protrusions along the extension direction of the second wire grooves, and the second lead wires in the second wire grooves are laid on the surfaces of the plurality of recesses and protrusions on the bottoms of the second wire grooves, so that the effective lengths of the second lead wires can be increased to thereby increase the resistance of the second lead wires. That is, the effective lead widths of the first lead wires, and the effective widths of the second lead wires can be set so that the resistance of the first lead wires are substantially the same as the resistance of the second lead wires to thereby address the problem that there is such a significant difference in resistance between the different lead wires in the peripheral circuit area that may result in a higher probability of display abnormality on the display panel, and consequently degrade the reliability of the display panel.

In some embodiments, two terminals of each lead wire of the first lead wires 10 and the second lead wires 20 are configured to be connected with a display area and a drive chip of the array substrate respectively; for example, each first lead wire 10 and each second lead wire 20 both have one terminal connected with a gate line in the display area, and the other terminal connected with a gate drive chip.

In some embodiments, as illustrated in FIG. 2, a shape of a side of each first lead wire 10 facing a corresponding first wire groove 11 is the same as a shape of the corresponding first wire groove 11, so that each first lead wire 10 covers the bottom and the sidewalls of the corresponding first wire groove 11. As can be apparent from FIG. 2, since each first lead wire 10 is laid out on both the bottom and the sidewalls of the corresponding first wire groove 11, each first lead wire 10 bends along a width direction thereof, thus increasing the effective width of each first lead wire 10.

In some embodiments, as illustrated in FIG. 3, a bottom surface of each second wire groove 21 appears wavy due to recesses 211 and protrusions 212 arranged alternately on the bottom surface of the second wire groove 21 along an extension direction of the second wire groove 21. In some embodiments, a shape of a side of each second lead wire 20 facing a corresponding second wire groove 21 is the same as a resulting shape of recesses 211 and protrusions 212 in the corresponding second wire groove 21, so that each second lead wire covers bottoms of corresponding respective recesses 211 and protrusions 212. As can be apparent from FIG. 3, each second lead wire 20 bends along an extension direction thereof, thus increasing the effective length of each second lead wire 20.

In some embodiments, the first wire grooves 11 and the second wire grooves 21 are fabricated in an etching process, and alike the first lead wires 10 and the second lead wires 20 are fabricated in an etching process.

In some embodiments, a width of each first wire groove 11 is the same as a width of each second wire groove 21 so that areas occupied by the first wire grooves 11 and the second wire grooves 21 in the peripheral circuit area can be reduced to thereby save a space on the array substrate.

In some embodiments, a width of a projection of each first lead wire 10 onto a surface of the peripheral circuit area is the same as a width of a projection of each second lead wire 20 onto the surface of the peripheral circuit area, so that the areas occupied by the first lead wires 10 and the second lead wires 20 in the peripheral circuit area can be reduced to thereby save the space on the array substrate.

In some embodiments, in order to facilitate the fabrication of the first lead wires 10 and the second lead wires 20, each first lead wire 10 and each second lead wire 20 are made of the same material, so that the first lead wires 10 and the second lead wires 20 can be formed in one etching process to thereby improve the efficiency of producing the array substrate.

In some embodiments, when the plurality of first lead wires 10 and the plurality of second lead wires 20 are connected with the same chip, since the size of the chip is typically smaller than the size of the display area of the array substrate, and the distance between a pin in a central area of the chip, and a wire corresponding thereto in the display area is shorter than the distance between a pin in an end area of the chip, and a wire corresponding thereto in the display area, therefore, in order to equalize the resistance of the plurality of lead wires, as illustrated in FIG. 1, the plurality of first lead wires 10 are configured to be connected with pins in the central area of the chip, and the plurality of second lead wires 20 are configured to be connected with pins in the end area of the chip. Since there is a larger effective lead width of each first lead wire 10, the resistance thereof can be alleviated from being raised due to an increased distance between the pin of the chip, and the wire in the display area; and since there is a larger effective length of each second lead wire 20, the resistance thereof can be alleviated from being lowered due to a reduced distance between the pin of the chip, and the wire in the display area, so that the resistance of each first lead wire 10 is substantially the same as the resistance of each second lead wire 20, thus addressing the problem of display abnormality arising from a significant difference in resistance between the lead wires.

In some embodiments, in order to further adjust the resistance of the lead wires, the array substrate further includes the third lead wire(s) (not illustrated in FIG. 1 to FIG. 3) arranged on the peripheral circuit area, where no wire groove(s) corresponding to the third lead wire(s) is(or are) arranged in the peripheral circuit area, thus an effective width of each third lead wire is smaller than that of each first lead wire 10, and an effective length thereof is smaller than that of each second lead wire 20. When there are a large number of lead wires as needed, the resistance of respective lead wires can be further equalized using the third lead wire(s), so that the resistance of the lead wires is substantially the same.

In some embodiments, a transverse section of each first wire groove 11 can be in one of a number of shapes. As illustrated in FIG. 2, for example, the transverse section of each first wire groove 11 is perpendicular to the extension direction of the each first wire groove 11, and shapes as a triangle; of course, the transverse section of each first wire groove 11 can alternatively shape as a rectangle, a trapezium, or an arc.

In some embodiments, longitudinal sections of each recess 211 and each protrusion 212 on the bottom surface of each second wire groove 21 can also be in one of a number of shapes. As illustrated in FIG. 3, for example, the longitudinal sections of each recess 211 and each protrusion 212 are parallel to an extension direction of a corresponding second wire groove 21, and shape as triangles; of course, the longitudinal sections of each recess 211 and each protrusion 212 on the bottom surface of each second wire groove 21 can alternatively shape as rectangles, trapezia, or arcs.

Based upon the same inventive concept, the embodiments of the disclosure further provide a display panel including the array substrate above according to the embodiments of the disclosure.

Alike the array substrate, the display panel can also address the problem in the related art that there is such a significant difference in resistance between the different lead wires in the peripheral circuit area that may result in a higher probability of display abnormality on the display panel, and consequently degrade the reliability of the display panel. And reference can be made to the embodiments of the array substrate above for an implementation of the display panel, so a repeated description thereof will be omitted here.

Based upon the same inventive concept, the embodiments of the disclosure further provide a display device including the display panel above according to the embodiments of the disclosure.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An array substrate, comprising a peripheral circuit area in which a plurality of first lead wires, a plurality of second lead wires, a plurality of first wire grooves for accommodating the plurality of first lead wires in a one-to-one correspondence manner, and a plurality of second wire grooves for accommodating the plurality of second lead wires in a one-to-one correspondence manner are arranged, wherein each of the plurality of second wire grooves comprises a plurality of recesses and protrusions arranged alternately on its bottom surface, along its extension direction, wherein:
   each of the plurality of first lead wires is arranged corresponding to one of the plurality of first wire grooves, and laid out on a bottom and sidewalls of a corresponding first wire groove; and
   each of the plurality of second lead wires is arranged corresponding to one of the plurality of second wire grooves, and laid out on surfaces of recesses and protrusions on a bottom surface of a corresponding second wire groove.

2. The array substrate according to claim 1, wherein a width of each of the plurality of first wire grooves is same as a width of each of the plurality of second wire grooves.

3. The array substrate according to claim 1, wherein a width of a projection of each of the plurality of first lead wires onto a surface of the peripheral circuit area is same as a width of a projection of each of the plurality of second lead wires onto the surface of the peripheral circuit area.

4. The array substrate according to claim 1, wherein each of the plurality of first lead wires and each of the plurality of second lead wires are made of a same material.

5. The array substrate according to claim 1, wherein the plurality of first lead wires are connected with pins in end areas of a chip, and the plurality of second lead wires are connected with pins in a central area, between the end areas, of the chip.

6. The array substrate according to claim 1, wherein the array substrate further comprises a third lead wire arranged on the peripheral circuit area and arranged with no corresponding wire groove.

7. The array substrate according to claim 1, wherein a transverse section of each of the plurality of first wire grooves is a rectangle, a trapezium, a triangle, or an arc; and is perpendicular to an extension direction of the each of the plurality of first wire grooves.

8. The array substrate according to claim 1, wherein longitudinal sections of each recess and each protrusion on the bottom surface of each of the plurality of second wire grooves are rectangles, trapezia, triangles, or arcs; and are perpendicular to an extension direction of the each of the plurality of second wire grooves.

9. A display panel, comprising an array substrate; wherein the array substrate comprises a peripheral circuit area in which a plurality of first lead wires, a plurality of second lead wires, a plurality of first wire grooves for accommodating the plurality of first lead wires in a one-to-one correspondence manner, and a plurality of second wire grooves for accommodating the plurality of second lead wires in a one-to-one correspondence manner are arranged, wherein each of the plurality of second wire grooves comprises a plurality of recesses and protrusions arranged alternately on its bottom surface, along its extension direction, wherein:
   each of the plurality of first lead wires is arranged corresponding to one of the plurality of first wire grooves, and laid out on a bottom and sidewalls of a corresponding first wire groove; and
   each of the plurality of second lead wires is arranged corresponding to one of the plurality of second wire grooves, and laid out on surfaces of recesses and protrusions on a bottom surface of a corresponding second wire groove.

10. The display panel according to claim 9, wherein a width of each of the plurality of first wire grooves is same as a width of each of the plurality of second wire grooves.

11. The display panel according to claim 9, wherein a width of a projection of each of the plurality of first lead wires onto a surface of the peripheral circuit area is same as a width of a projection of each of the plurality of second lead wires onto the surface of the peripheral circuit area.

12. The display panel according to claim 9, wherein each of the plurality of first lead wires and each of the plurality of second lead wires are made of a same material.

13. The display panel according to claim 9, wherein the plurality of first lead wires are connected with pins in end areas of a chip, and the plurality of second lead wires are connected with pins in a central area, between the end areas, of the chip.

14. The display panel according to claim 9, wherein the array substrate further comprises a third lead wire arranged on the peripheral circuit area and arranged with no corresponding wire groove.

15. The display panel according to claim 9, wherein a transverse section of each of the plurality of first wire grooves is a rectangle, a trapezium, a triangle, or an arc; and is perpendicular to an extension direction of the each of the plurality of first wire grooves.

16. The display panel according to claim 9, wherein longitudinal sections of each recess and each protrusion on the bottom surface of each of the plurality of second wire grooves are rectangles, trapezia, triangles, or arcs; and are perpendicular to an extension direction of the each of the plurality of second wire grooves.

17. A display device, comprising the display panel according to claim 9.

* * * * *